United States Patent
Andersen

(10) Patent No.: US 12,538,448 B2
(45) Date of Patent: Jan. 27, 2026

(54) AIRFLOW GUIDE

(71) Applicant: SCHNEIDER ELECTRIC IT CORPORATION, Foxboro, MA (US)

(72) Inventor: Claus Aabjerg Andersen, Kolding (DK)

(73) Assignee: SCHNEIDER ELECTRIC IT CORPORATION

( * ) Notice: Subject to any disclaimer, the term of this patent is extended or adjusted under 35 U.S.C. 154(b) by 227 days.

(21) Appl. No.: 18/372,214

(22) Filed: Sep. 25, 2023

(65) Prior Publication Data

US 2024/0130072 A1     Apr. 18, 2024

Related U.S. Application Data

(60) Provisional application No. 63/416,093, filed on Oct. 14, 2022.

(51) Int. Cl.
*H05K 7/20* (2006.01)

(52) U.S. Cl.
CPC ................ *H05K 7/20145* (2013.01)

(58) Field of Classification Search
CPC ........... H05K 7/20145; H05K 7/20727; H05K 7/20718; H05K 7/20736; H05K 7/20536; H05K 7/20563
See application file for complete search history.

(56) References Cited

U.S. PATENT DOCUMENTS

| | | | |
|---|---|---|---|
| 8,477,491 B1 | 7/2013 | Ross et al. | |
| 8,737,067 B1 | 5/2014 | Kim et al. | |
| 10,952,353 B1 | 3/2021 | Bean, Jr. et al. | |
| 11,240,930 B2* | 2/2022 | Zheng | H05K 7/20727 |
| 12,156,379 B2* | 11/2024 | Tajima | G06F 1/20 |
| 12,262,486 B2* | 3/2025 | Tang | H05K 7/20145 |
| 2013/0115869 A1 | 5/2013 | Alshinnawi et al. | |
| 2014/0342652 A1 | 11/2014 | Dong et al. | |
| 2020/0275584 A1* | 8/2020 | Chiang | H05K 7/20772 |
| 2020/0343155 A1* | 10/2020 | Kiyonaga | H05K 1/0206 |
| 2020/0388432 A1* | 12/2020 | Dede | H05K 1/165 |
| 2022/0095480 A1* | 3/2022 | Waters | G10K 11/172 |
| 2023/0225075 A1* | 7/2023 | Zhou | H05K 7/20145 361/695 |

OTHER PUBLICATIONS

Extended European Search Report from corresponding European Application No. 23203117.9 dated Mar. 25, 2024.

* cited by examiner

*Primary Examiner* — Stephen S Sul
(74) *Attorney, Agent, or Firm* — FIG. 1 Patents

(57) ABSTRACT

An airflow guide includes at least one first channel configured to direct a portion of air from a first fan in a first direction a second power component and at least one second channel configured to direct a portion of air from a second fan in a second direction to a first power component. The airflow guide further includes a first body portion having the at least one first channel and the at least one second channel. The at least one first channel may include several channels each configured to direct the portion of air in the first direction to the second power component and the at least one second channel may include several channels each configured to direct the portion of air in the second direction to the first power component.

20 Claims, 7 Drawing Sheets

AIRFLOW GUIDE

CROSS-REFERENCE TO RELATED APPLICATION

This application claims the benefit under 35 U.S.C. § 119(e) of U.S. Provisional Patent Application No. 63/416,093 titled AIRFLOW GUIDE filed on Oct. 14, 2022, which is incorporated herein by reference in its entirety for all purposes.

BACKGROUND OF DISCLOSURE

1. Field of Disclosure

Embodiments of the disclosure relate generally to safety features, and more specifically, to an airflow guide that is used within an equipment rack to direct airflow from a working fan to power components relying on airflow from a failing fan, and configured to mitigate the risk of exposure of person to an arc flash events when connecting and disconnecting electronic equipment from busbars and fan modules within the equipment rack.

2. Discussion of Related Art

Centralized data centers for computer, communications and other electronic equipment have been in use for a number of years. More recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) provided in equipment racks to ensure that the equipment within the data centers receives continuous power throughout any black out or brown out periods.

A typical power distribution unit consists of a rack frame chassis and removable power distribution modules or power modules for short, which are often removed for replacement or service. The power modules connect to a live busbar provided at a back of the equipment rack, and when the power module is removed, the live busbar is exposed. Often, the equipment rack includes a warning label to power down the equipment rack when working near the busbar to avoid hazards, such as arc flash, but such a label oftentimes can be ineffective. Other approaches have been tried, such as installing a blanking panel to block access to the live bus bar. However, this approach, when implemented, requires additional time and parts.

Further, fan modules are used to cool the electronic equipment housed in the equipment rack. Often, fan modules are removed and replaced from the equipment rack. Arc flashing can occur during such removal and replacement of such fan modules. Moreover, current power systems with multiple fans do not ensure redundant airflow reaches power components from an adjacent fan when a fan closest to these components fails.

SUMMARY OF DISCLOSURE

One aspect of the present disclosure is directed to an airflow guide, comprising at least one first channel configured to direct a portion of air from a first fan in a first direction and at least one second channel configured to direct a portion of air from a second fan in a second direction.

Embodiments of the airflow guide further may include a first body portion having the at least one first channel and the at least one second channel. The at least one first channel may include three channels configured to direct the portion of air from the first fan in the first direction to a second power component. The at least one second channel may include three channels configured to direct the portion of air from the second fan in the second direction to a first power component. The at least one first channel may include several channels each configured to direct the portion of air in the first direction and the at least one second channel may include several channels each configured to direct the portion of air in the second direction. The first direction may be below the airflow guide and the second direction may be above the airflow guide. The airflow guide further may include a second body portion extending from the first body portion. The second body portion may be planar and may be configured to extend between a first power component and a second power component. The second body portion may include a positioning feature configured to assist an operator in installing the airflow guide. The first body portion and the second body portion may be integrally formed with one another. The first body portion and the second body portion may be fabricated from glass reinforced epoxy. The airflow guide may be disposed approximately equidistant from centers of the first fan and the second fan.

Another aspect of the present disclosure is directed to a power system, comprising a first fan, a second fan, a first power component configured to be cooled by the first fan, a second power component configured to be cooled by the second fan, and an airflow guide. The airflow guide includes at least one first channel configured to direct a portion of air from the first fan in a first direction to the second power component and at least one second channel configured to direct a portion of air from the second fan in a second direction to the first power component.

Embodiments of the power system further may include a first body portion having the at least one first channel and the at least one second channel. The at least one first channel may include three channels configured to direct the portion of air from the first fan in the first direction to a second power component. The at least one second channel may include three channels configured to direct the portion of air from the second fan in the second direction to a first power component. The at least one first channel may include several channels each configured to direct the portion of air in the first direction and the at least one second channel may include several channels each configured to direct the portion of air in the second direction. The first direction may be below the airflow guide and the second direction may be above the airflow guide. The power system further may include a second body portion extending from the first body portion. The second body portion may be planar and configured to extend between the first power component and the second power component. The second body portion may include a positioning feature configured to assist an operator in installing the airflow guide. The first body portion and the second body portion may be integrally formed with one another. The first body portion and the second body portion may be fabricated from glass reinforced epoxy. The airflow guide may be disposed approximately equidistant from centers of the first fan and the second fan.

Yet another aspect of the present disclosure is directed to a method of directing airflow within an equipment rack enclosure including a first power component that is cooled by a first fan and a second power component that is cooled by a second fan, the first power component being positioned within the equipment rack enclosure above the second power component. In one embodiment, the method comprises: directing a portion of air from the first fan in a first direction to the second power component by at least one first channel of an airflow guide; and directing a portion of air from the second fan in a second direction to the first power component by at least one second channel of the airflow guide.

Embodiments of the method further may include configuring the airflow guide with a first body portion having the at least one first channel and the at least one second channel. The at least one first channel may include three channels configured to direct the portion of air from the first fan in the first direction to the second power component. The at least one second channel may include three channels configured to direct the portion of air from the second fan in the second direction to the first power component. The at least one first channel may include several channels each configured to direct the portion of air in the first direction and the at least one second channel may include several channels each configured to direct the portion of air in the second direction. The first direction may be below the airflow guide and the second direction may be above the airflow guide. The airflow guide further may include a second body portion extending from the first body portion. The second body portion may be planar and may be configured to extend between a first power component and a second power component. The second body portion may include a feature configured to assist an operator in installing the airflow guide. The first body portion and the second body portion may be integrally formed with one another. The first body portion and the second body portion may be fabricated from glass reinforced epoxy.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
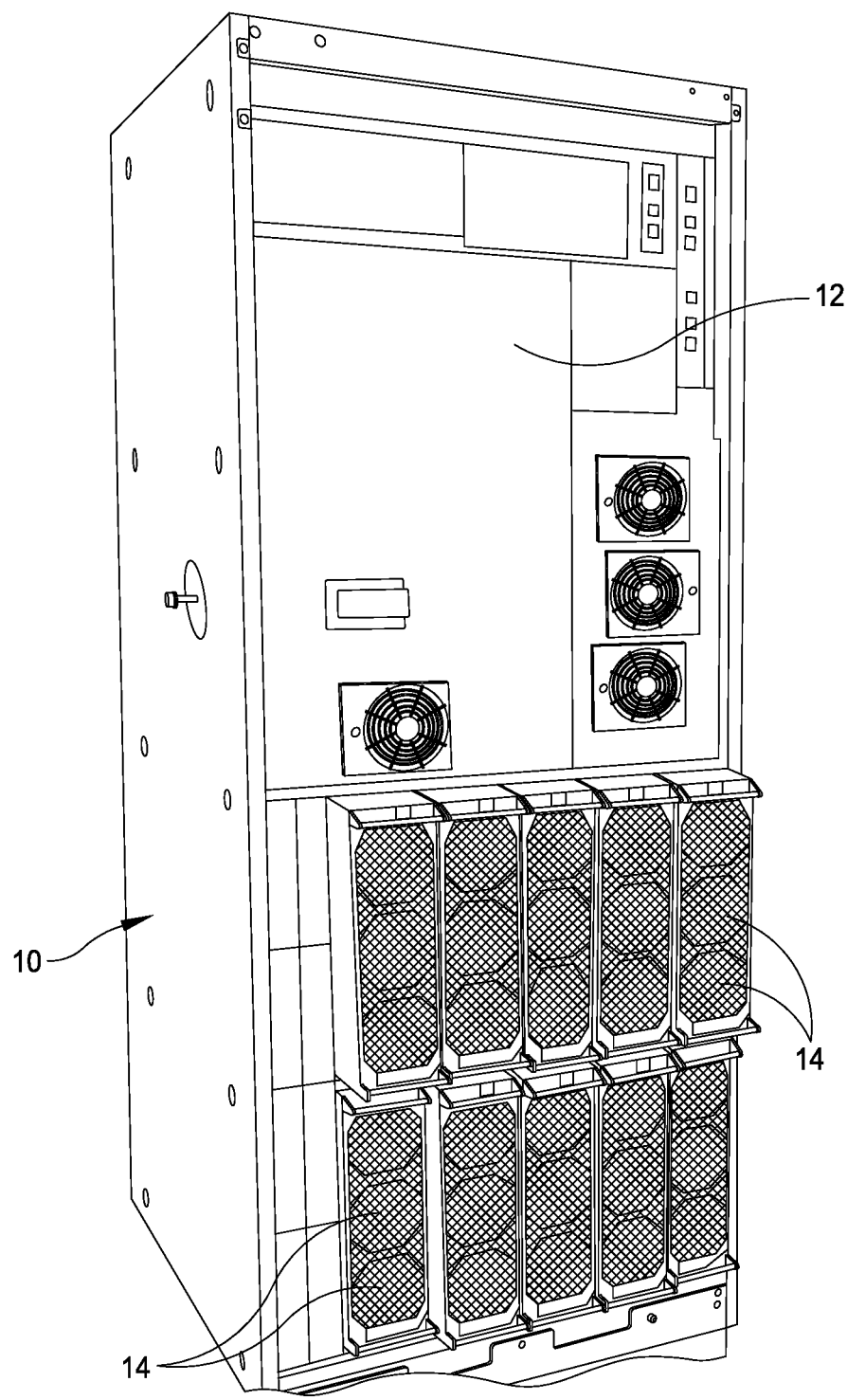
FIG. 1 is a perspective view of a front side of an equipment rack having several fan modules configured to direct airflow within an interior of the equipment rack.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

At least one method exists to nearly eliminate any risk of arcing to occur, namely, to completely isolate the three phases from each other with appropriate insulation material. A power component fulfilling its function on phase "A" is completely separated from the power component fulfilling the same function on phase "B" and phase "C." Full separation means that a severe component malfunction (i.e., explosion) is prevented from spreading to adjacent phases. Consequently, for a nearby person, a risk of being harmed from such type of incident is significantly reduced.

However, in systems including a fan for cooling the power components, full separation means that if a fan stops working, the power component behind the non-operable fan will lose cooling and will rapidly overheat, thereby resulting in a system shutdown for safety reasons. One method to overcome this risk is to have two fans installed instead of one to cool the particular power component. For a 3-phase system, this means six fans instead of three fans. However, fans are costly, and take up valuable space. Moreover, fans include parts that wear, having a finite life. It is more desirable to configure the system with fewer fans. In one desirable system with phase separating insulation, a minimum quantity of three fans is installed to facilitate normal operation conditions. If one fan fails, a modern UPS system will sense it and alert to call for a technician to come and replace the failed or failing fan within two or three days. Meanwhile, the system needs just enough air to prevent overheating of the power component that the fan is designed to cool. Cooling will be less, the temperature will be higher, but the system will maintain operation. Such a mode of operation is often referred to as "limp home" mode. One aspect of the present disclosure is the provision of an optimal compromise between a desire for complete insulation of the three phases and the "limp home" mode solution.

At least one embodiment of the present disclosure is directed to a phase separation airflow guide that is used to direct airflow within an enclosure. As used herein, "enclosures" and "racks" are used to describe apparatus designed to support electronic equipment.

In some embodiments, the airflow guide is configured to direct air from an adjacent, operable fan towards power components in front of a failed fan. The airflow guide further is configured to increase an air travel distance that an arc must travel between power components, thereby decreasing the likelihood of arc formation decreasing duration of arcs.

In some embodiments, the airflow guide is positioned vertically between two adjacent fans and horizontally between the fans and power components, e.g., power modules.

In some embodiments, the airflow guide has upward guides that direct air upwards and downward guides that direct air downwards.

In some embodiments, the airflow guide can be made of electrically insulating material.

In some embodiments, an equipment rack can be configured with a power system having two fans and two power components. In some embodiments, the power system includes an airflow guide with a first channel that directs a portion of air from the first fan to the second power component and a second channel that directs a portion of air from the second fan to the first power component. This structure can be extended along a width of the equipment rack so that a third channel directs a portion of air from a third fan to the second power component and a fourth channel directs a portion of air from a fourth fan to the first power component.

Figure 6:
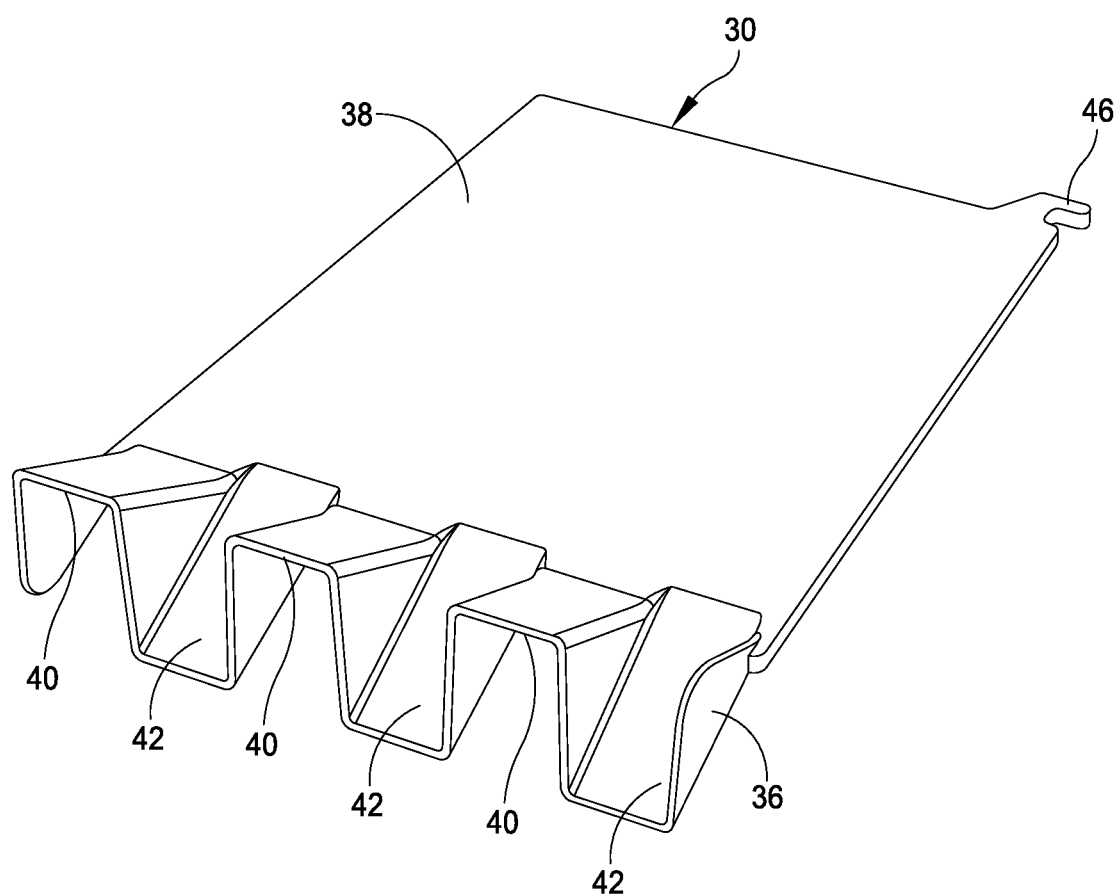
FIG. 6 is a perspective view of the phase separation airflow guide.
Figure 7:
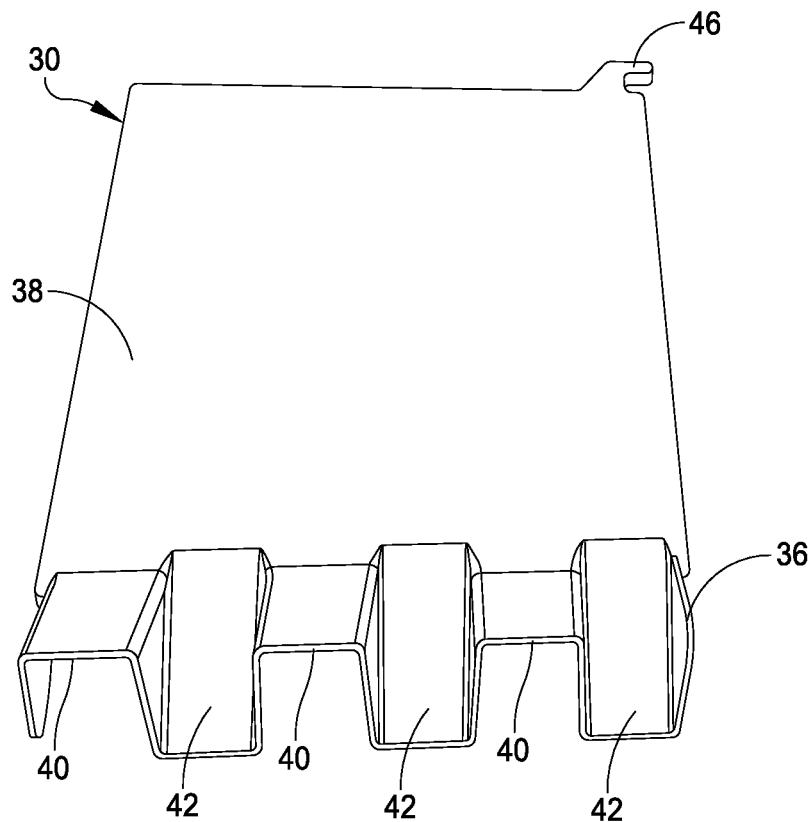
FIG. 7 is a front perspective view of the phase separation airflow guide.
Figure 8:
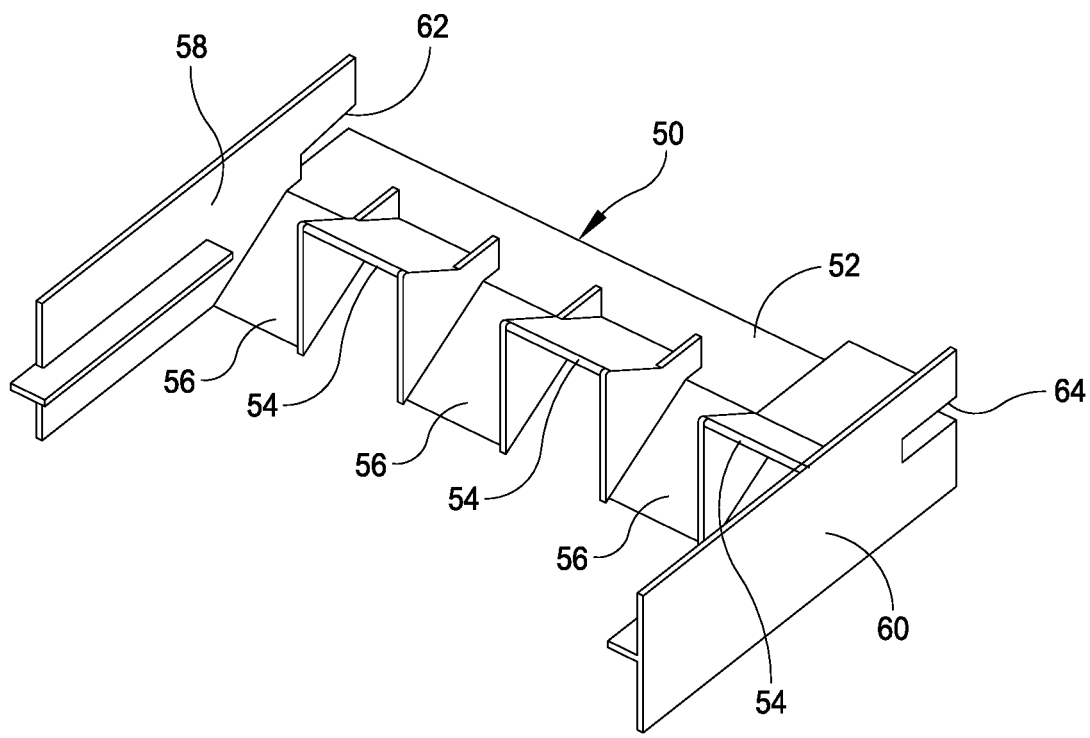
FIG. 8 is a perspective view of an airflow guide of another embodiment of the present disclosure.

In some embodiments, the airflow guide may be fabricated from one or more separate components made from plastic or other material, with a geometry same or similar to that shown in FIGS. 6 and 7 or in FIG. 8. The airflow guide can be formed with three channels to direct airflow downwards, three separate channels direct airflow upwards. The airflow guide can be configured with a different number of channels to direct air downward and upward.

In some embodiments, in normal operating conditions, all fans in the power system are running (e.g., with the same or different speed and deliver same or different amounts of air.)

In some embodiments, in normal operating conditions, a majority of air from each fan may be expelled forward as shown in the drawing figures.

In some embodiments, a portion of air coming from each fan is directed by the airflow guide to an adjacent chamber. In some embodiments, two or more chambers may get the same amount of air but from two different fans.

In some embodiments, in the event of an abnormal operation condition, e.g., one of the fans stop running completely or merely slows down, the airflow guide directs air from the operable fan(s) to the power components.

In some embodiments, a portion of air coming from the upper adjacent fan is directed by the airflow guide in a first direction to the bottom chamber in which some air will flow over thyristor modules (power semiconductors) in the bottom chamber even when a fan in the bottom chamber failed.

In some embodiments, a sensor and a controller of the power system may detect that the bottom fan failed, and may compensate for this failure by increasing speed(s) of the remaining fan(s) to increase airflow across the thyristor in the bottom chamber. Similarly, if one of the other fans has a failure (e.g., a top fan), the airflow guide may direct a portion of air from the bottom fan in a second direction towards the thyristor in the upper chamber. This structure assists with cooling the thyristor in the upper chamber.

In some embodiments, a risk of an arc evolution may be reduced by the airflow guide because a distance that an arc must travel between components with different voltages is increased. Thus, the airflow guide may act as an arc barrier. Further, the arc may need to turn 180°. These factors may decrease the risk of an arc forming and/or decrease the duration or magnitude of the arc.

In some embodiments, the airflow guide may facilitate redundant airflow to power components from an adjacent fan when a fan closest to these components fails.

In some embodiments, the air flow guide may facilitate delivering air from an adjacent fan to components in front of a failed fan. The airflow guide may increase the air-travel distance an arc must travel between power components, thereby decreasing the likelihood of arc formation and decreasing duration of arcs.

In some embodiments, the airflow guide may have a portion that rests between two power components at different voltages. The material of at least this portion of the airflow guide may be electrically insulative and prevent short circuits or arcing between the components.

In some embodiments, the airflow guide may be positioned vertically between two adjacent fans and horizontally between the fans and power components.

In some embodiments, the airflow guide may have upward compartments that direct air upwards and/or downward compartments that direct air downward.

Referring to the drawings, and more particularly to FIG. 1, an equipment rack is generally indicated at 10. In one embodiment, the equipment rack 10 is configured to support power components in stacked arrangement within mounting slots provided in an interior of the equipment rack. The equipment rack 10 can be configured to support any number of types of power components, including but not limited to thyristor modules. As is known, a thyristor is a semiconductor device used for high-power applications. Thyristors are used in high current and voltage applications, and are used to control alternating currents. As shown, the equipment rack 10 includes a front side 12 having a panels to enclose the interior of the equipment rack and several fan modules, each indicated at 14, which provide airflow within the interior of the equipment rack to cool the power components. The number and location of the fan modules 14 can be varied depending on the position of the power components in the equipment rack 10. Further, the fan modules 14 may be coupled to a controller to control the operation of the fan modules.

Figure 2:
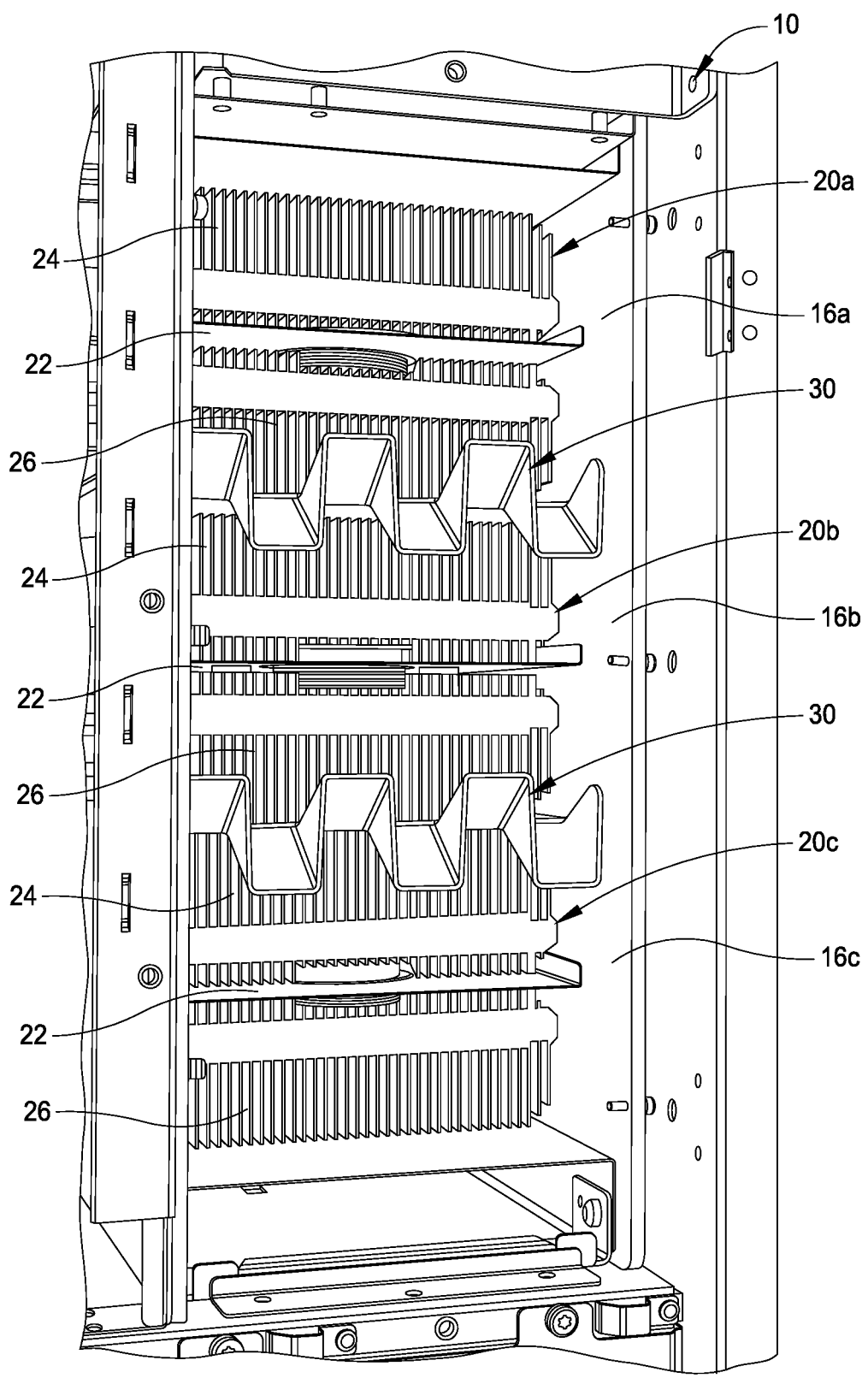
FIG. 2 is a perspective view of a power component section of the equipment rack having panels and fan modules removed to show airflow guides of an embodiment of the present disclosure.
Figure 3:
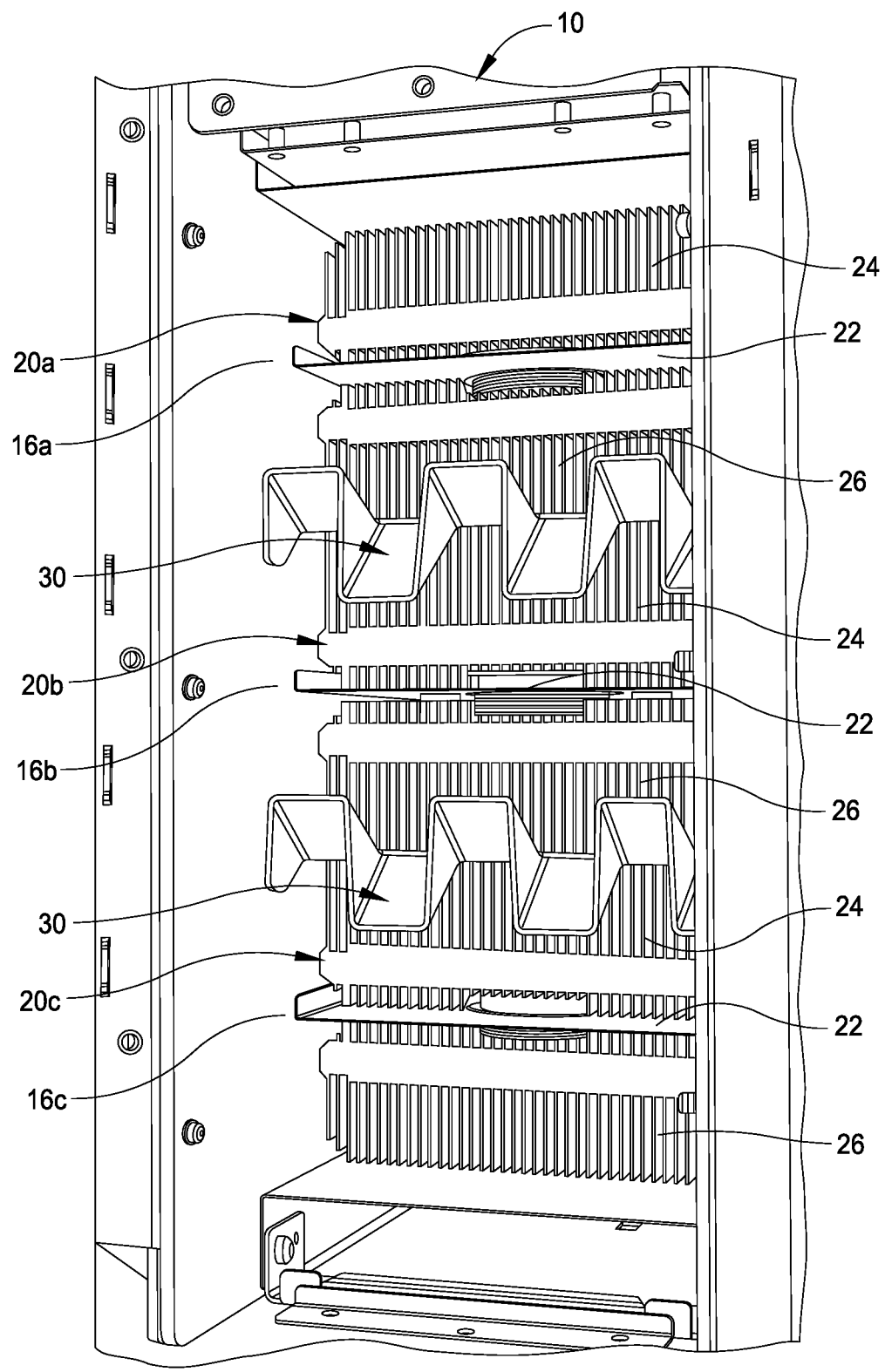
FIG. 3 is another perspective view of the power component section of the equipment rack having the airflow guides.

Referring to FIGS. 2 and 3, a portion of an interior of the equipment rack 10 is shown. The equipment rack 10 includes three horizontal mounting slots, indicated at 16a, 16b, 16c, which are provided to receive power components. Specifically, the mounting slots 16a, 16b, 16c are configured to receive thyristor modules, generally indicated at 20a, 20b, 20c, respectively. Thus, in the shown embodiment, there are three thyristor modules 20a, 20b, 20c provided in the equipment rack 10. Each thyristor module 20a, 20b, 20c includes a thyristor 22 and heatsinks 24, 26 on a top of the thyristor (heatsink 24) and on a bottom of the thyristor (heatsink 26). The number and type of power components provided within the equipment rack 10 can vary depending on the intended use of the equipment rack.

In one embodiment, separating the thyristors modules 20a, 20b, 20c are two airflow guides, each generally indicated at 30. As shown, one airflow guide 30 is positioned between the heatsink 26 of the thyristor module 20a and the heatsink 24 of thyristor module 20b and another airflow guide 30 is positioned between the heatsink 26 of the thyristor module 20b and the heatsink 24 of thyristor module 20c. As will be described in greater detail below, each airflow guide 30 is configured to direct airflow from its respective fan module 14 to both thyristor modules (20a and 20b, or 20b and 20c) between which the airflow guide extends. In a certain embodiment, the airflow guide 30 is disposed approximately equidistant from centers of the first fan module and the second fan module, which is provided below the first fan module.

Figure 4:
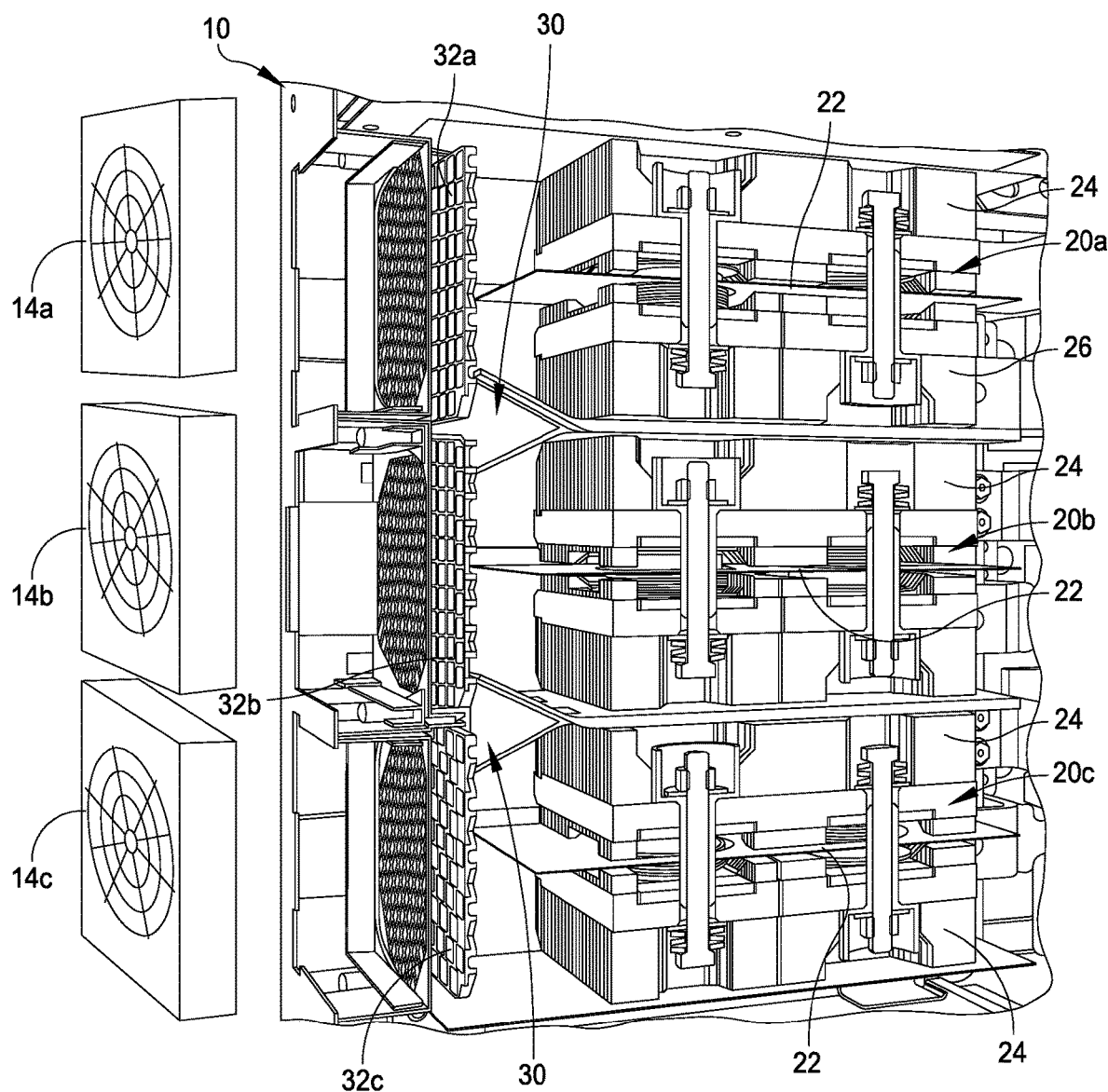
FIG. 4 is a perspective view of the power component section of the equipment rack with side panels removed to show body portions of the airflow guides.
Figure 5:
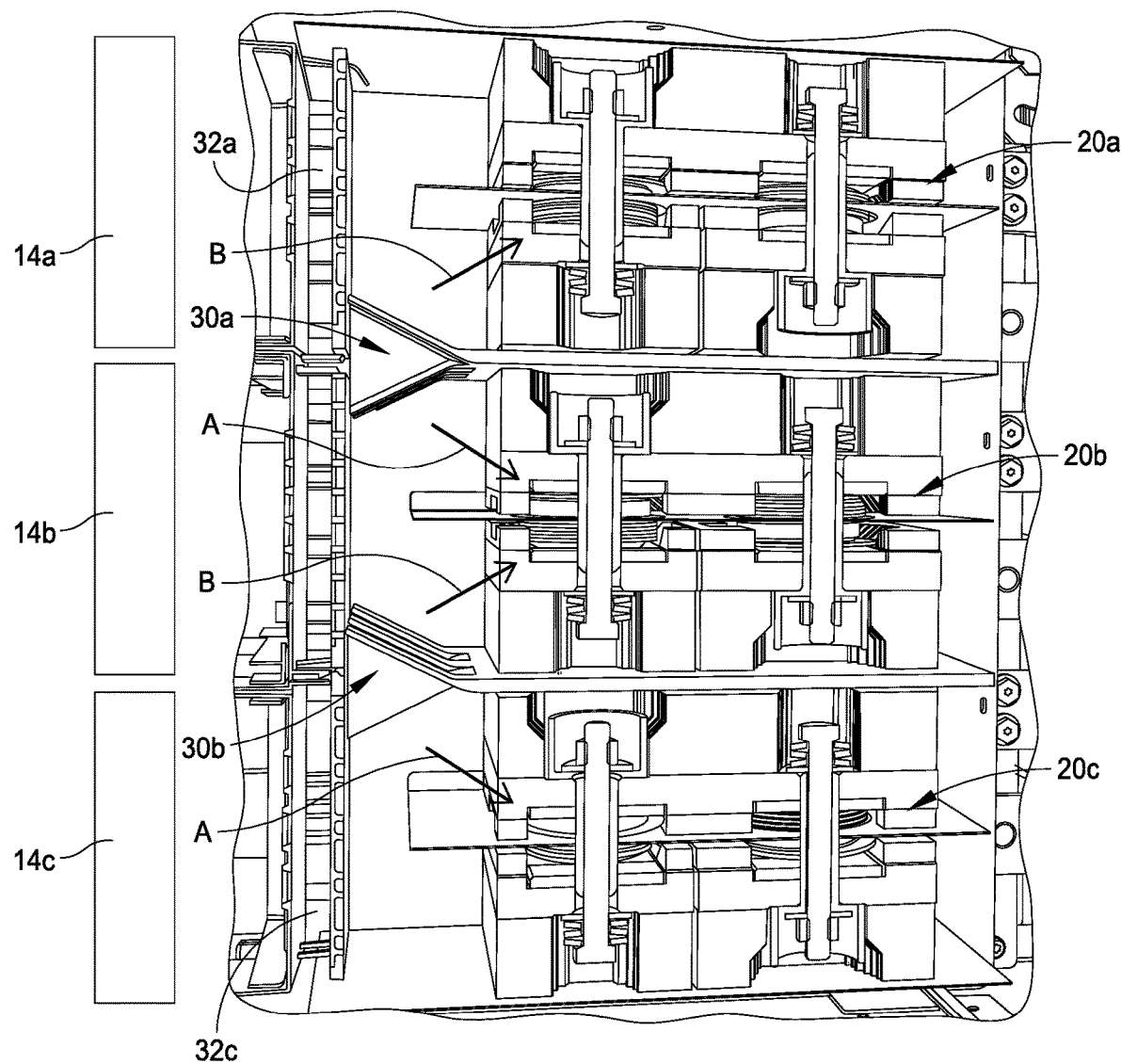
FIG. 5 is a side view of the equipment rack with the side panels removed to show the body portions of the airflow guide.

Referring additionally to FIGS. 4 and 5, the fan modules 14a, 14b, 14c are separated from the equipment to reveal arc-energy blockers 32a, 32b, 32c provided in front of the thyristor 22 of each thyristor module 20a, 20b, 20c, respectively. The arc-energy blockers 32a, 32b, 32c are designed to protect an individual standing in front of the front side of the equipment rack 10 from an arc flash incident. Arc flash is the light and heat produced by an arc fault between power components. Each arc-energy blocker 32a, 32b, 32c include a perforated body that allows air to flow through the perforated body into the interior of the rack enclosure 10 while inhibiting arc flash from exiting the rack enclosure. Thus, airflow generated by the fan modules 14a, 14b, 14c is directed toward the power component.

In one example, as will be discussed in greater detail with respect to the airflow guide 30 illustrated in FIGS. 6 and 7, a first airflow guide, e.g., airflow guide 30a in FIG. 5, is configured to direct a portion of airflow from a first fan module, e.g., fan module 14a in a first direction (arrow A) to second power component, e.g. power component 20b, and to direct a portion of airflow from the second fan module, e.g., fan module 14b in a second direction (arrow B) to the first power component, e.g., power component 20a. Similarly, a second airflow guide, e.g., airflow guide 30b in FIG. 5, is configured to direct a portion of airflow from a first fan module, e.g., fan module 14b in a first direction (arrow A) to second power component, e.g. power component 20c, and to direct a portion of airflow from the second fan module, e.g., fan module 14c in a second direction (arrow B) to the first power component, e.g., power component 20b. As shown, the first direction is below the airflow guide 30 and the second direction is above the airflow guide 30. As mentioned above, the airflow guide 30 provides airflow to adjacently placed power components 20 in the event of failure of one fan module 14. In some embodiments, in normal operating conditions, all fan modules 14a, 14b, 14c in the power system are running (e.g., with the same or different speed and deliver same or different amounts of air.)

In normal operating conditions, a majority of airflow from each fan module 14 may be expelled as shown in the drawing figures. Specifically, a portion of airflow coming from each fan module 14 is directed by the airflow guide 30 to an adjacent chamber housing the power component 20. Thus, two or more chambers having power components 20 may get the same amount of air but from two different fan modules 14. In the event of an abnormal operation condition, e.g., one of the fan modules 14 stop running completely or merely slows down, the airflow guide 30 directs air from the operable fan module(s) to the power components 20. A portion of airflow coming from the upper adjacent fan module 14 is directed by the airflow guide 30 in the first direction (arrow A) to the bottom chamber in which some air will flow over the power component 20 in the bottom chamber even when a fan module 14 in the bottom chamber failed.

In one embodiment, a sensor and a controller of the power component and/or the equipment rack 10 may detect that the bottom fan module 14 failed, and may compensate for this failure by increasing speed(s) of the remaining fan module (s) to increase airflow across the power component 20 in the bottom chamber. Similarly, if one of the other fan modules 14 has a failure (e.g., the top fan module), the airflow guide 30 may direct a portion of air from the bottom fan module 14 in a second direction towards the power component 20 in the upper chamber. The airflow guide 30 assists with cooling the power component in the upper chamber.

In one embodiment, the airflow guide 30 is configured to increase air travel distance an arc must travel. Specifically, the first body portion 36 of the airflow guide 30 is proximate to the fan module, thereby maximizing a distance arc flash must travel. Further, a cross sectional opening between the two opposing phases is minimized to provide an obstacle for air (air plasma if it is an arc) to travel between two phases.

Referring additionally to FIGS. 6 and 7, the airflow guide 30 includes a first body portion 36 and a second body portion 38 extending from the first body portion. As shown, the first body portion 36 includes several first channels formed therein, each indicated at 40, and several second channels formed therein, each indicated at 42. In one embodiment, the first body portion 36 includes three first channels 40 formed therein, which are each configured to direct air in the first direction (arrow A) to the second power component, e.g., power component 20b, and three second channels 42 formed therein, which are each configured to direct air in the second direction (arrow B) to the first power component, e.g., power component 20a. Although three first channels 40 and three second channels 42 are shown and described herein, the first body portion 36 of the airflow guide 30 can be configured with any number of channels selectively configured to direct airflow in the first and second directions. For example, the first body portion 36 can be configured with two or four first channels and two or four second channels, respectively.

In one embodiment, the second body portion 38 is planar and configured to extend between the first power component, e.g., power component 20a, and the second power component, e.g., power component 20b. The purpose of the second body portion 38 is to isolate the power components, e.g., power components 20a, 20b, from one another and to limit the effect of arc flash incidents to operators standing in front of the equipment rack 10. The second body portion 38 includes a positioning feature configured to assist an operator in installing the airflow guide 30. The first body portion 36 and the second body portion 38 are integrally formed with one another. As will be shown with reference to the airflow guide shown in FIG. 8, the first body portion and the second body portion can comprise two separate components that are configured to attach or otherwise fit within one another to achieve the desired structure. In a certain embodiment, the first body portion and the second body portion are fabricated from glass reinforced epoxy by an injection molding process.

Still referring to FIGS. 6 and 7, with particular reference to FIG. 6, the second body portion 38 of the airflow guide 30 includes a Poka-yoke positioning feature 46, which is configured to prevent an operator from improperly installing the airflow guide. Specifically, the positioning feature 46 prevents the operator from installing the airflow guide 30 in the wrong direction with the first body portion 36 having channels 40, 42 positioned at the back of the equipment rack 10 when installing the airflow guide within the mounting slot, e.g., mounting slots 16a, 16b, 16c, of the equipment rack 10.

Referring to FIG. 8, another embodiment of an airflow guide is generally indicated at 50. As shown, the airflow guide 50 includes a body portion 52 including several first channels formed therein, each indicated at 54, and several second channels formed therein, each indicated at 56. As with the configuration of airflow guide 30, the body portion 52 of the airflow guide 50 includes three first channels 54 formed therein, which are each configured to direct air in a first direction to a second power component, e.g., power component 20b, and three second channels 56 formed therein, which are each configured to direct air in the second direction to the first power component, e.g., power component 20a. The structure of the first and second channels 54, 56 of the body portion 52 of airflow guide 50 is similar if not identical to the structure of the first and second channels 40, 42 of the first body portion 36 of airflow guide 30. The airflow guide 50 further includes side portions 58, 60, which extend from opposite sides the body portion 52, and are configured to be secured within the mounting slot, e.g., mounting slots 16a, 16b, 16c, of the equipment rack 10. Although not shown, the airflow guide 50 can be configured to receive a planar arc flash panel, similar to the second body portion 38 of airflow guide 30, within slots 62, 64 formed in the side portions 58, 60, respectively. The arc flash panel is disposed between the power components.

In one embodiment, airflow guide 50 can be fabricated from glass-filled epoxy (GPO3), which be purchased in sheets and cut to size with sawing or milling processes, with portions being fabricated by an injection molding process.

Various controllers may execute various operations discussed above. For example, as discussed above, the controller may control the fan modules, amongst other operations. Using data stored in associated memory and/or storage, the controller may execute one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. An airflow guide, comprising:
   at least one first channel configured to direct a portion of air from a first fan in a first direction;
   at least one second channel configured to direct a portion of air from a second fan in a second direction; and
   a first body portion having the at least one first channel and the at least one second channel, the at least one first channel including several channels each configured to direct the portion of air in the first direction and the at least one second channel including several channels each configured to direct the portion of air in the second direction, the first direction being below the airflow guide and the second direction being above the airflow guide.

2. The airflow guide of claim 1, wherein the at least one first channel includes three channels configured to direct the portion of air from the first fan in the first direction to a second power component.

3. The airflow guide of claim 2, wherein the at least one second channel includes three channels configured to direct the portion of air from the second fan in the second direction to a first power component.

4. The airflow guide of claim 1, further comprising a second body portion extending from the first body portion.

5. The airflow guide of claim 4, wherein the first body portion and the second body portion are integrally formed with one another.

6. The airflow guide of claim 5, wherein the first body portion and the second body portion are fabricated from glass reinforced epoxy.

7. The airflow guide of claim 1, wherein the airflow guide is disposed approximately equidistant from centers of the first fan and the second fan.

8. A power system comprising the first fan, the second fan, a first power component configured to be cooled by the first fan, a second power component configured to be cooled by the second fan, and the airflow guide of claim 1, the at least one first channel of the airflow guide being configured to direct the portion of air from the first fan in the first direction to the second power component, and the at least one second channel of the airflow guide being configured to direct the portion of air from the second fan in the second direction to the first power component.

9. An airflow guide, comprising:
   at least one first channel configured to direct a portion of air from a first fan in a first direction;
   at least one second channel configured to direct a portion of air from a second fan in a second direction;
   a first body portion having the at least one first channel and the at least one second channel; and
   a second body portion extending from the first body portion,
   wherein the second body portion is planar and configured to extend between a first power component and a second power component.

10. The airflow guide of claim 9, wherein the second body portion includes a positioning feature configured to assist an operator in installing the airflow guide.

11. A power system, comprising:
    a first fan;
    a second fan;
    a first power component configured to be cooled by the first fan;
    a second power component configured to be cooled by the second fan; and
    an airflow guide including
       at least one first channel configured to direct a portion of air from the first fan in a first direction to the second power component,
       at least one second channel configured to direct a portion of air from the second fan in a second direction to the first power component, and
       a first body portion having the at least one first channel and the at least one second channel, the at least one first channel including several channels each configured to direct the portion of air in the first direction and the at least one second channel including several channels each configured to direct the portion of air in the second direction, the first direction being below the airflow guide and the second direction being above the airflow guide.

12. The power system of claim 11, wherein the at least one first channel includes three channels configured to direct the portion of air from the first fan in the first direction to a second power component.

13. The power system of claim 12, wherein the at least one second channel includes three channels configured to direct the portion of air from the second fan in the second direction to a first power component.

14. The power system of claim 11, further comprising a second body portion extending from the first body portion.

15. The power system of claim 14, wherein the first body portion and the second body portion are integrally formed with one another.

16. The power system of claim 15, wherein the first body portion and the second body portion are fabricated from glass reinforced epoxy.

17. The power system of claim 11, wherein the airflow guide is disposed approximately equidistant from centers of the first fan and the second fan.

18. A power system, comprising:
a first fan;
a second fan;
a first power component configured to be cooled by the first fan;
a second power component configured to be cooled by the second fan; and
an airflow guide including
at least one first channel configured to direct a portion of air from the first fan in a first direction to the second power component,
at least one second channel configured to direct a portion of air from the second fan in a second direction to the first power component,
a first body portion having the at least one first channel and the at least one second channel, and
a second body portion extending from the first body portion,
wherein the second body portion is planar and configured to extend between the first power component and the second power component.

19. The power system of claim 18, wherein the second body portion includes a positioning feature configured to assist an operator in installing the airflow guide.

20. A method of directing airflow within an equipment rack enclosure including a first power component that is cooled by a first fan and a second power component that is cooled by a second fan, the first power component being positioned within the equipment rack enclosure above the second power component, the method comprising:
directing a portion of air from the first fan in a first direction to the second power component by at least one first channel of an airflow guide; and
directing a portion of air from the second fan in a second direction to the first power component by at least one second channel of the airflow guide,
wherein directing the portion of air from the first fan in the first direction includes direction a portion of air through at least one first channel and directing the portion of air from the second fan in the second direction includes directing a portion of air through at least one second channel, and
wherein a first body portion has the at least one first channel and the at least one second channel, and a second body portion extends from the first body portion, the second body portion being planar and configured to extend between the first power component and the second power component.

* * * * *